United States Patent
Chen

(10) Patent No.: US 6,277,693 B1
(45) Date of Patent: Aug. 21, 2001

(54) SELF-ALIGNED PROCESS FOR FORMING SOURCE LINE OF ETOX FLASH MEMORY

(75) Inventor: Chin-Ming Chen, Hsinchu (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 0 days.

(21) Appl. No.: 09/515,302

(22) Filed: Feb. 29, 2000

(30) Foreign Application Priority Data

Dec. 16, 1999 (TW) .......................................... 88122143 A

(51) Int. Cl.⁷ .............................................. H01L 21/8247
(52) U.S. Cl. ............................................ 438/264; 438/279
(58) Field of Search .................................. 438/257–267, 438/279

(56) References Cited

U.S. PATENT DOCUMENTS

| | | | |
|---|---|---|---|
| 5,966,602 | * 10/1999 | Kawazu et al. | 438/258 |
| 5,998,262 | * 12/1999 | Chen | 438/257 |
| 6,013,551 | * 1/2000 | Chen et al. | 438/264 |
| 6,027,971 | * 2/2000 | Cho et al. | 438/257 |
| 6,103,574 | * 8/2000 | Iwasaki | 438/257 |

* cited by examiner

Primary Examiner—Richard Booth
(74) Attorney, Agent, or Firm—Jiawei Huang; J.C. Patents

(57) ABSTRACT

A self-aligned process for forming the source lines of an ETOX flash memory is proposed. A plurality of device isolation lines that are parallel to each other is formed in a substrate. A plurality of parallel stacked gates that are perpendicular to the device isolation lines is next formed over the substrate. Between two adjacent stacked gates is a region capable of accommodating at least one source line parallel to the stacked gates. A cap layer is formed over each stacked gate, and then spacers are formed over the sidewalls of the stacked gates. The device isolation structure within the source line region is removed, and then a conductive line is formed within the source line region of the substrate.

11 Claims, 6 Drawing Sheets

US 6,277,693 B1

SELF-ALIGNED PROCESS FOR FORMING SOURCE LINE OF ETOX FLASH MEMORY

CROSS-REFERENCE TO RELATED APPLICATION

This application claims the priority benefit of Taiwan application serial no. 88122143, filed Dec. 16, 1999.

BACKGROUND OF THE INVENTION

1. Field of the Invention

The present invention relates to a method of forming flash memory. More particularly, the present invention relates to a self-aligned process for forming the source lines of an ETOX flash memory.

2. Description of the Related Art

ETOX flash memory is a type of conventional erasable programmable read only memory (EPROM) that also includes a thin tunnel oxide layer in its structure. In fact, the name ETOX refers to an EPROM with a tunnel oxide layer.

FIG. 1 is a schematic top view of a portion of an ETOX flash memory structure. FIG. 2A is a cross-sectional view along line A–A' of FIG. 1 showing a unit memory cell of the ETOX flash memory, while FIG. 2B is a cross-sectional view along line B–B' of FIG. 1.

As shown in FIGS. 1, 2A and 2B, an ETOX flash memory structure is formed in several steps. First, longitudinal device isolation structures 110 are formed in a substrate 100. In general, with a critical dimension larger than 0.25 $\mu$m, field oxide (FOX) is frequently used to form the device isolation structures 110. However, for devices having a critical dimension smaller than 0.25 $\mu$m, shallow trench isolation (STI) structures are used more often. In the subsequent step, a tunnel oxide layer 120, a floating gate 130, an oxide/nitride/oxide (ONO) composite dielectric layer 140 and a control gate 150 are sequentially formed over the substrate 100. The floating gate 130, the ONO dielectric layer 140 and the control gate 150 together constitute a stacked gate.

The device isolation structures 110 in the region for forming the desired source lines are removed and so trenches 190 are formed in the substrate 100. Using the stacked gate as a mask, an ion implantation is carried out to implant ions into the exposed substrate 100. Hence, a source line 160 and a drain terminal 170 are formed in the substrate 100 on each side of the gate stack.

Subsequent operation includes forming a bit line contact 180 above the drain terminal 170 for connecting the drain terminal 170 to the bit line (not shown) over the stacked gate. The bit lines run in a direction parallel to the device isolation structures 110 but perpendicular to the stacked gates. The source line 160 runs in a direction perpendicular to the device isolation structures 110 but parallel to the stacked gates. Since subsequent operations necessary for forming a complete ETOX flash memory should be familiar to persons skilled in the art of semiconductor manufacturing, detailed descriptions of the steps are omitted here.

In the aforementioned process of removing the device isolation structures 110 in preparation for implanting ions into the substrate 100 to form the source line, a number of problems are often encountered. FIG. 3 is a cross-sectional view along line III–III' of the source line 160 in FIG. 1. In FIG. 3, cross-sectional structures of adjacent memory cells are also drawn. After the removal of device isolation structures 110, trenches 190 are formed in the substrate 100. The subsequent implantation of ions into the exposed substrate 100 results in the formation of source lines 160. Since STI structures 110 are often used when critical dimension of device drops to below 0.25 $\mu$m, trenches 190 with high aspect ratio are formed after the device isolation structures 110 are removed. Hence, no matter at what angle the incoming ion beam is set, whether it comes from direction 200a, 200b or 200c, only a portion of the substrate surface of each trench 190 such as 195a, 195b or 195c, is doped. Unless the ion beam changes its angle of tilt and adjusts its implantation energy level continuously, doped ions cannot form a continuous conductive band that links regions like 195a, 195b and 195c in each trench 190. Because continuous adjustment of the ion beam to form a uniformly doped substrate layer is a difficult process, most often than not, electrical resistivity of the source lines 160 rises and discontinuity problems intensify.

As resistivity of the source line 160 rises, operational speed of the ETOX flash memory drops. On the other hand, if the level of concentration of dopants in the substrate 100 is raised to increase the electrical conductivity of the source lines 160, the band-to-band tunneling current may increase, resulting in a larger leakage current. Furthermore, a source line contact (not shown in the figure) must be erected for every 32 bits if the electrical resistivity of the source lines is too high. Hence, the ultimate level of integration for the ETOX flash memory is restricted.

SUMMARY OF THE INVENTION

The invention provides a self-aligned process for forming the source lines of an ETOX flash memory. A plurality of device isolation lines that are parallel to each other is formed in a substrate. A plurality of parallel stacked gates that are perpendicular to the device isolation lines is next formed over the substrate. Between two adjacent stacked gates is a region capable of accommodating at least one source line parallel to the stacked gates. A cap layer is formed over each stacked gate, and then spacers are formed over the sidewalls of the stacked gates. The device isolation structure within the source line region is removed, and then a conductive line is formed within the source line region of the substrate.

According to the self-aligned process of forming the source lines of an ETOX flash memory, the device isolation line within the source line region is removed before forming a conductive line to serve as the source line. A material having high electrical conductivity such as metal or doped polysilicon can be used to form the conductive line so that operational speed and the level of integration of the ETOX flash memory are increased.

In addition, if the conductive line is formed using doped polysilicon, a subsequent annealing operation can be carried out to drive the dopants within the doped polysilicon into the source line region of the substrate. Hence, a uniform and continuously doped source line is formed in the substrate under the conductive line.

Accordingly, the present invention provides a self-aligned process for forming the source lines of an ETOX flash memory capable of lowering electrical resistivity of the source lines.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

Figure 1:
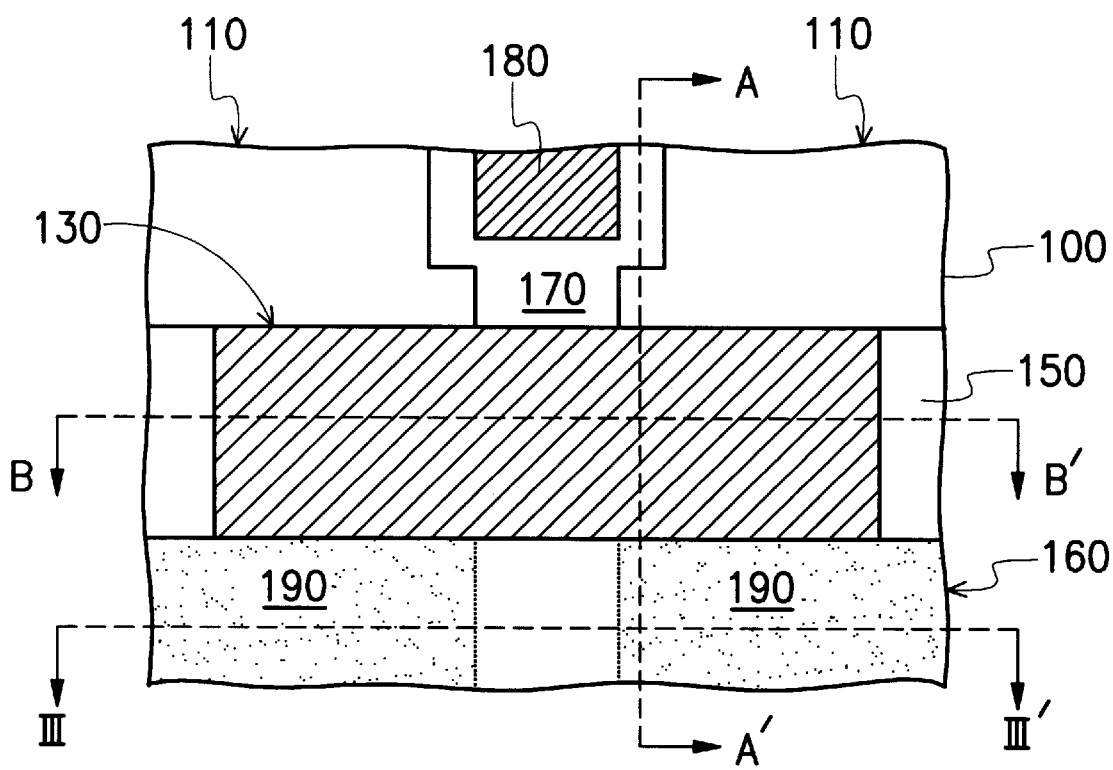
FIG. 1 is a schematic top view of a portion of an ETOX flash memory structure.
Figure 2A:
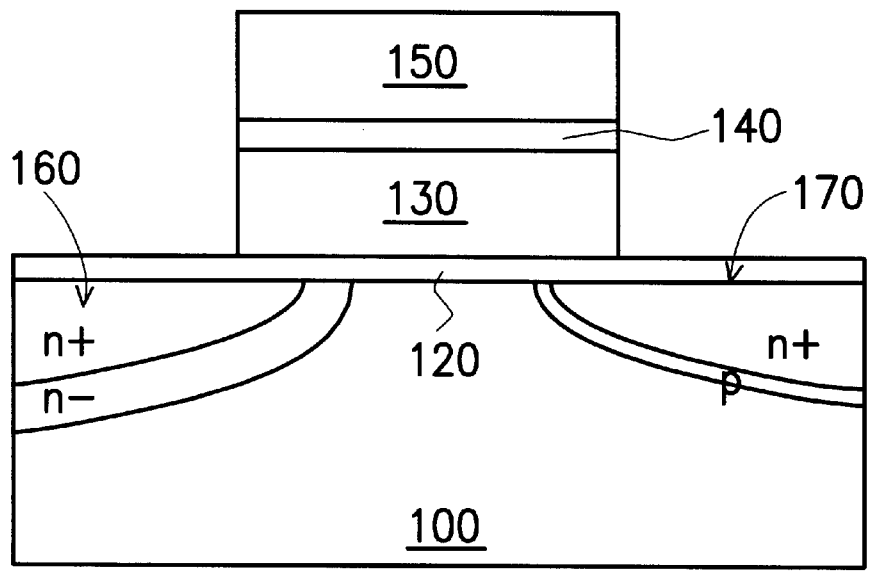
FIG. 2A is a cross-sectional view along line A–A' of FIG. 1 showing a unit memory cell of the ETOX flash memory.
Figure 2B:
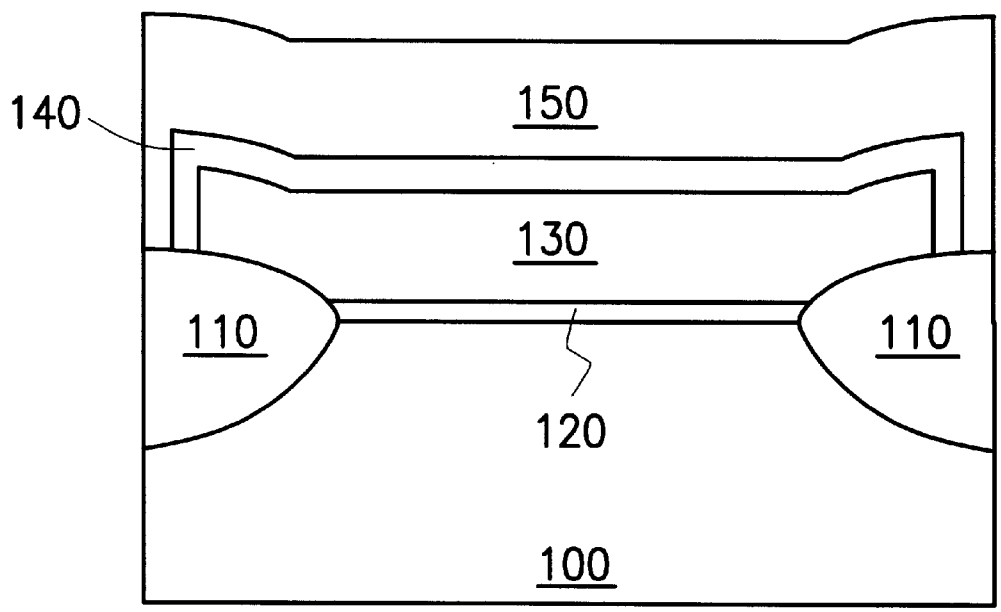
FIG. 2B is a cross-sectional view along line B–B' of FIG. 1 showing a unit memory cell of the ETOX flash memory.
Figure 3:
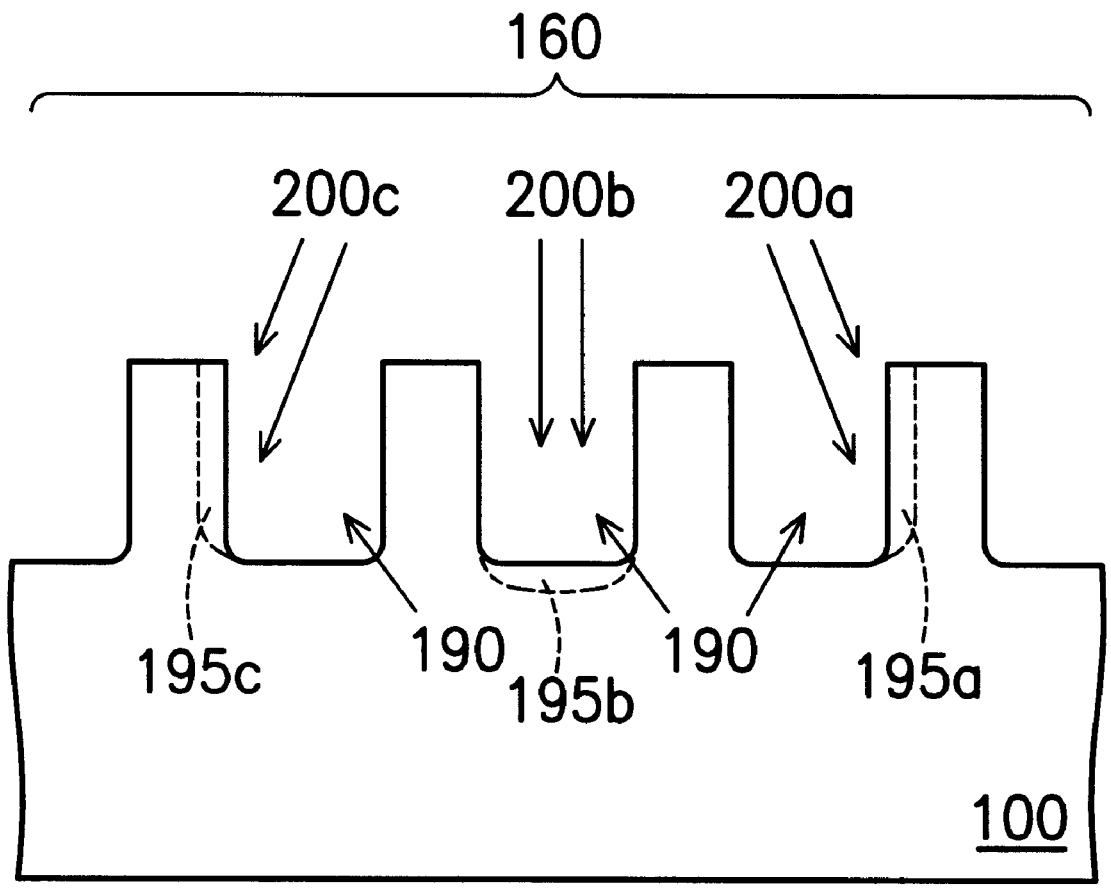
FIG. 3 is a cross-sectional view along line III–III' of the source line in FIG. 1.

Reference will now be made in detail to the present preferred embodiments of the invention, examples of which are illustrated in the accompanying drawings. Wherever possible, the same reference numbers are used in the drawings and the description to refer to the same or like parts.

Figure 4:
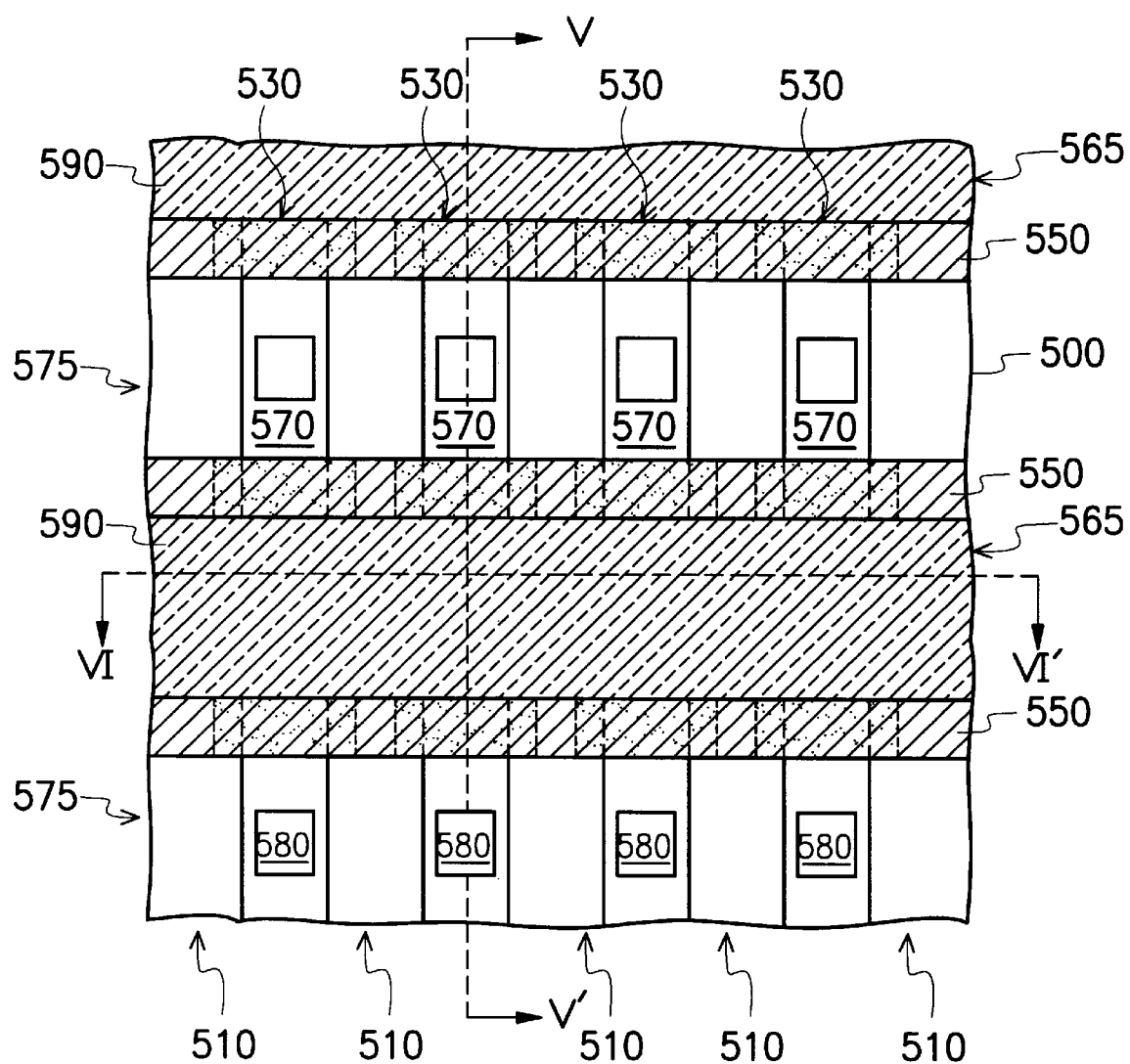
FIG. 4 is a schematic top view showing the layout of an ETOX flash memory fabricated according to one preferred embodiment of this invention.

FIG. 4 is a schematic top view showing the layout of an ETOX flash memory fabricated according to one preferred embodiment of this invention. As shown in FIG. 4, the substrate 500 contains a plurality of device isolation lines 510 that are parallel to each other. However, those device isolation structures 510 within the source line region have to be removed before the source lines 565 are formed. The device isolation structures 510 can be shallow trench isolation (STI) or field oxide, for example. A floating gate 530 and a control gate 550 are located above the substrate 500. The floating gate 530 and the control gate 550 together with a dielectric layer (not shown in FIG. 4) form a stacked gate. The stacked gates are parallel to each other but perpendicular to the device isolation structures 510. The source line 565 and the drain array 575 are formed in alternating position between adjacent stacked gates. Each drain array 575 comprises a plurality of drain terminals 570 between the device isolation structures 510. Furthermore, there is a bit line contact 580 above each drain terminal 570 for electrically connecting the drain terminal 570 to the bit line (not shown in the figure).

Figure 5A:
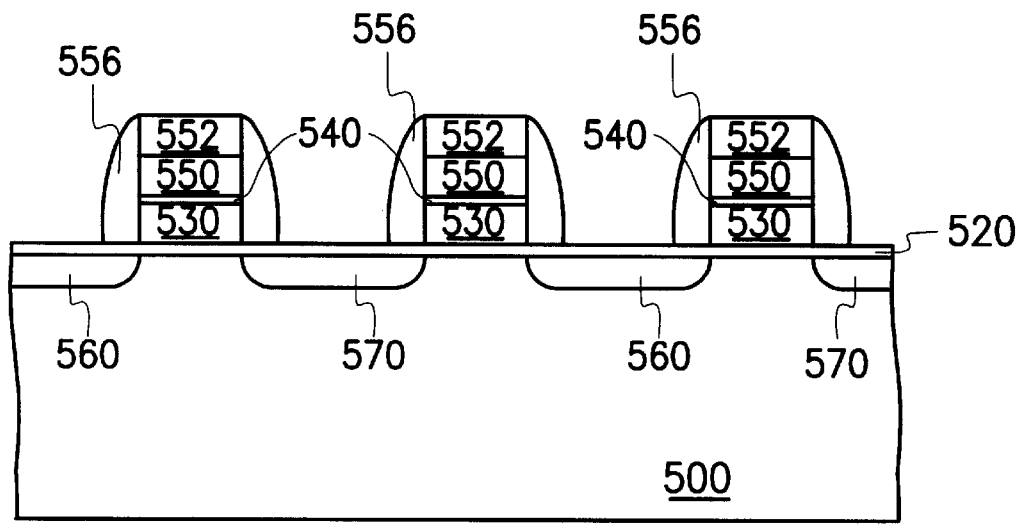
FIGS. 5A and 5B are cross-sectional views along line V–V' of FIG. 4 showing the progression of steps for producing the source lines of an ETOX flash memory according to this invention.
Figure 5B:
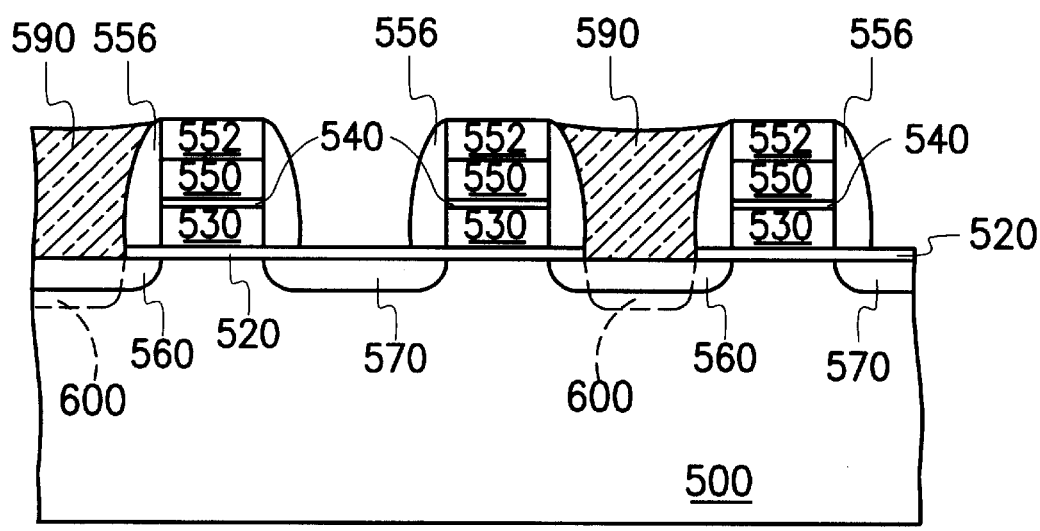

FIGS. 5A and 5B are cross-sectional views along line V–V' of FIG. 4 showing the progression of steps for producing the source lines of an ETOX flash memory according to this invention. Similarly, FIGS. 6A and 6B are cross-sectional views along line VI–VI' of FIG. 4.

First, as shown in FIG. 5A, a substrate 500 having a tunnel oxide layer 520 and a stacked gate thereon is provided. The stacked gate comprises a floating gate 530, a dielectric layer 540 and a control gate 550. For example, the floating gate 530 can be a doped polysilicon layer, the dielectric layer 540 can be an oxide/nitride/oxide composite layer and the control gate 550 can be a doped polysilicon or a polycide layer.

A cap layer 552 is formed over the stacked gate, and then spacers 556 are formed on the sidewalls of the stacked gate. The cap layer 552 and the spacers can be silicon nitride layers formed, for example, by chemical vapor deposition. A source terminal 560 and a drain terminal 570 are formed on each side of the gate stack. The source terminal 560 and the drain terminal 570 can be formed, for example, by implanting ions into the exposed substrate while using the gate stack as an implantation mask.

Figure 6A:
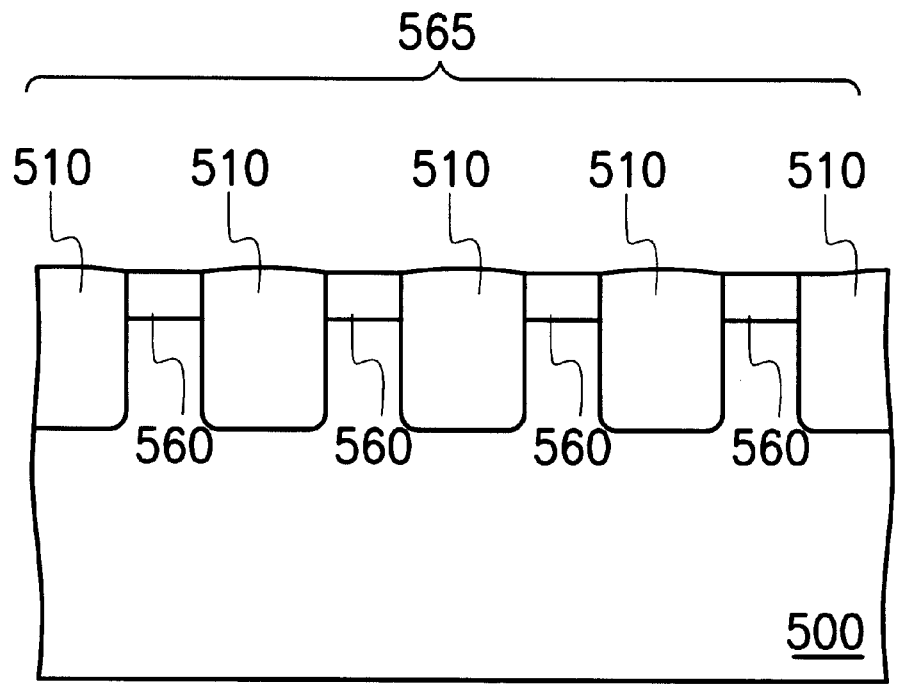
FIGS. 6A and 6B are cross-sectional views along line VI–VI' of FIG. 4 showing the progression of steps for producing the source lines of an ETOX flash memory according to this invention.
Figure 6B:
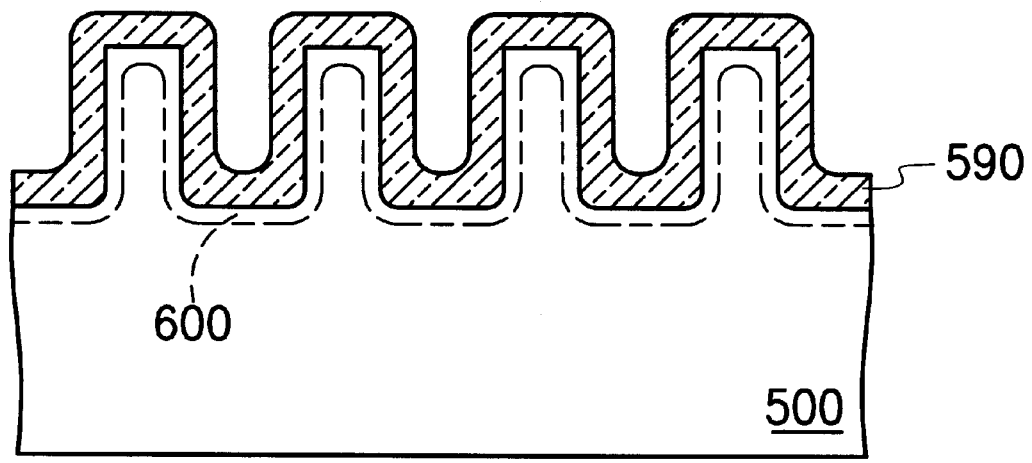

As shown in FIG. 6A, the device isolation structures 510 in the source line 565 region are removed, for example, by wet etching using an etchant that has a high etching rate for the device isolation material. For example, if the device isolation structure 510 is made from silicon oxide, diluted hydrofluoric acid solution can be used in the etching step.

As shown in FIG. 6B, a source line 565 region with an undulating profile is formed in the substrate 500 after removing the device isolation structures 510 within the source line 565 region. A conductive layer is formed over the substrate 500, and then conductive material above the spacers 556 is removed to form a conductive line 590 as shown in FIGS. 5B and 6B. The conductive line 590 can be a metallic or doped polysilicon layer formed, for example, by physical or chemical vapor deposition. The method of removing excess conductive material above the spacers 556 depends on the material selected to form the conductive layer. For example, back etching or chemical-mechanical polishing can be chosen according to the type of conductive material.

If doped polysilicon is used to form the conductive line 590, a subsequent annealing operation can be carried out to drive the dopants (such as phosphorus) within the doped polysilicon layer into the substrate 500. Ultimately, a source line doped region 600 is formed in the substrate 500 just under the conductive line 590. In FIG. 6B, the source line doped region 600 has a smooth and continuous profile.

In summary, a conductive line is formed over a source line in this invention. Hence, resistivity of the source line is reduced considerably. With a higher electrical conductivity, the operational speed and the level of integration of ETOX flash memory are increased. Furthermore, if the conductive line is a doped polysilicon layer, a continuous doped region in the substrate underneath the conductive line may be formed by annealing so that electrical conductivity is further increased.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A self-aligned process for forming the source lines of an ETOX flash memory, comprising the steps of:

providing a substrate;

forming a plurality of parallel device isolation lines in the substrate;

forming a plurality of parallel stacked gates above the substrate such that the stacked gates are perpendicular to the device isolation lines, and there is at least one source line region parallel to the stacked gates between two adjacent stacked gates;

forming a cap layer over each of the stacked gates;

forming spacers on sidewalls of each stacked gate;

removing the device isolation lines inside the source line regions; and forming a conductive line within the source line region.

2. The self-aligned process of claim 1, wherein the device isolation line has a shallow trench isolation structure.

3. The self-aligned process of claim 1, wherein the step of forming the cap layer includes depositing silicon nitride by chemical vapor deposition.

4. The self-aligned process of claim 1, wherein the step of forming the spacers includes depositing silicon nitride over the sidewalls of the stacked gates by chemical vapor deposition.

5. The self-aligned process of claim 1, wherein the step of forming the conductive lines includes the substeps of:

forming a conductive layer over the substrate; and removing the conductive layer lying above the cap layer.

6. The self-aligned process of claim 5, wherein the step of forming the conductive layer includes depositing doped polysilicon by chemical vapor deposition.

7. The self-aligned process of claim 6, wherein after the step of forming the conductive line over the substrate, further includes performing an annealing operation.

8. The self-aligned process of claim 5, wherein the step of removing the conductive layer lying above the cap layer includes etching.

9. The self-aligned process of claim 5, wherein the step of removing the conductive layer lying above the cap layer includes chemical-mechanical polishing.

10. A process for forming a flash memory, comprising the steps of:

providing a substrate;

forming a plurality of parallel device isolation in the substrate;

forming a plurality of parallel stacked gates above the substrate such that the stacked gates are perpendicular to the device isolation;

forming a cap layer over each of the stacked gates;

forming spacers on sidewalls of each of the stacked gates;

performing ion implantation to form source and drain regions in predetermined regions of the substrate, such that at least one source line region parallel to the stacked gates between two adjacent stacked gates;

removing the device isolation lines inside the source regions;

forming a conductive line within the source region; and performing an annealing operation to form a continuous region underneath the conductive line.

11. The process for forming a flash memory of claim 10, wherein the conductive line is made from doped polysilicon.

* * * * *